United States Patent [19]

Gordon

[11] Patent Number: 4,922,077
[45] Date of Patent: May 1, 1990

[54] METHOD OF LASER MARKING METAL PACKAGES

[75] Inventor: Larry E. Gordon, Chelmsford, Mass.

[73] Assignee: Raytheon Company, Lexington, Mass.

[21] Appl. No.: 304,976

[22] Filed: Jan. 31, 1989

[51] Int. Cl.⁵ ............................................ B23K 26/00
[52] U.S. Cl. ........................... 219/121.68; 219/121.61; 219/121.62; 219/121.78; 219/121.83
[58] Field of Search ....................... 219/121.61, 121.62, 219/121.68, 121.69, 121.78, 121.8, 121.83, 121.86

[56] References Cited

U.S. PATENT DOCUMENTS

| | | | |
|---|---|---|---|
| 3,609,588 | 9/1971 | McKnight | 219/121.65 X |
| 3,700,850 | 10/1972 | Lumley et al. | 219/121.69 |
| 4,335,295 | 1/1982 | Fowler | 219/121.69 X |
| 4,370,542 | 1/1983 | Mills et al. | 219/121.69 X |
| 4,626,656 | 12/1986 | Ootsuka et al. | 219/121.68 |
| 4,720,621 | 1/1988 | Langen | 219/121.68 X |
| 4,791,267 | 12/1988 | Yokoyama et al. | 219/121.69 |

*Primary Examiner*—C. L. Albritton
*Attorney, Agent, or Firm*—Edmund J. Walsh; Richard M. Sharkansky

[57] ABSTRACT

A method of marking metal packages using a laser. The power in the laser beam is set to a predetermined value. The laser is then controlled in a four pass process with the Q-switching frequency of the laser, the speed at which the laser beam is moved across the package and the width of the lines drawn by the laser being set for each pass.

11 Claims, 2 Drawing Sheets

METHOD OF LASER MARKING METAL PACKAGES

BACKGROUND OF THE INVENTION

This invention relates generally to marking integrated circuit packages and more particularly to indelibly marking metal packages for integrated circuits.

In the electronics industry, components are often sealed in standard sized packages. Diverse components, therefore, look the same and some marking must be included on the package to differentiate them.

Various kinds of ink have been used to mark packages. The ink is readable when applied, but wears off over time. When exposed to severe environmental conditions, the ink wears off faster. For packages made of metal or other material to which ink does not readily adhere, the markings wear off very rapidly. Worn off markings are a particular problem in military applications. Military procurement standards require that electronic components incorporated in military systems have readable markings even after exposure to severe environmental conditions. Since many components for military use are enclosed in metal packages, ink marking is inadequate for military applications.

Laser marking has also been contemplated. Laser marking apparatus have been developed and are sold commercially. In these apparatus, the package to be marked is mounted in the path of a laser beam. The marking apparatus contains optical elements which can direct the beam to various points on a surface of the package. By appropriate control of these optical elements, often by a computer running a software program, the laser beam traces out the desired markings on the package.

Various parameters of the apparatus might be controllable to affect the appearance of the marking. In a commercially available apparatus, the controllable parameters might include: the width of lines traced out by the laser beam; the speed at which the laser beam traces out a line; the Q-switch frequency of the laser; the diameter of the aperture through which the laser beam passes; and the current supplied to the laser.

The energy in the laser beam "burns" or "blasts" away parts of the package to cut grooves in it. A problem with laser marking is that the visible contrast between the grooves and the rest of the package can be very slight. Thus, even though the grooves are indelible, the markings can not be easily read. An additional problem with laser marking of metal is that the laser, being a light beam, tends to reflect from metal surfaces. If too much of the beam reflects from the surface, no mark can be made.

To solve these problems, a four pass marking process has been suggested. In other words, for each line to appear on the package, the laser beam passes over the same spot four times with different combinations of the parameters for aperture size, Q-switching frequency, speed and line width. The value of the current parameter is set empirically to a value which makes readable marks.

It has been observed with the parameters listed in Table I, the current could be adjusted to produce readable lines. The parameters are used with an Nd:YAG laser producing a 0.0059 inch wide beam at a wavelength of 1.064 nanometers and having a focal length of 2.88 inches. The lines produced are not simply grooves, but turn dark during the marking process.

TABLE I

| PASS | 1 | 2 | 3 | 4 |
| --- | --- | --- | --- | --- |
| Aperture | OUT | IN | IN | OUT |
| Q-Switch Frequency (KHz) | 6 | 3 | 10 | CW |
| Line Sweep (min/sec) | 200 | 400 | 4 | 80 |
| Line Width (mm) | N/A | N/A | 4 | N/A |

The entry "IN" in Table I indicates an aperture of approximately 80 mm is placed in the path of the laser beam. The entry "OUT" indicates the aperture is taken out of the path of the laser beam.

The entry "CW" in Table I for Q-switch frequency stands for continuous wave. In other words, the laser produces an output continuously as opposed to a pulsed output. The entries "N/A" for line width values implies that the line width is roughly as thick as the laser beam. In contrast, where a numerical value is given for the line width parameter, it implies the laser beam is oscillated perpendicular to the direction of the line with the amplitude of the oscillations given by the value for line width.

A problem with marking packages according to this technique is that it is inconvenient to empirically adjust the current to get readable markings. Several packages might be ruined in the process of adjusting the current, which can involve a significant cost, especially if gold plated packages are used. Additionally, in production facilities where packages are marked continuously, the current may need to be adjusted periodically due to changes in laser operation or the operation of the marking apparatus. The time and cost of empirically adjusting the current periodically is undesirable. Alternatively, supervision of the marking process to ensure the marking is adequate is also undesirable.

An additional problem with the known marking process is that the current may need to be adjusted for each package to be marked. Military procurement specifications require electronics components to be enclosed in packages comprising a base layer of Kovar, a plating of nickel, roughly 100 to 300 microinches thick and a plating of gold roughly 50 to 150 microinches thick. This specification allows considerable variations in the thicknesses of the plating layers and the known process does not always produce uniform dark markings for all thicknesses allowed by the specification.

It would be desirable to simply and inexpensively set the parameters of the laser marking apparatus to produce readable markings on all packages regardless of variations in the thicknesses of the layers in the package.

SUMMARY OF THE INVENTION

With the foregoing background in mind, it is an object of this invention to provide a process for marking metal packages with indelible, readable marks.

It is a further object of this invention to provide a process for marking metal packages with parameters which can be inexpensively and simply set.

It is yet another object of this invention to provide a process which marks metal packages plated with gold and nickel layers of variable thicknesses.

The foregoing and other objects of this invention are accomplished by a laser marking apparatus with a power meter measuring the power of the laser beam. The current to the laser is adjusted until the beam has a predetermined output value. The package is then positioned in the beam with the focal point of the beam slightly below the surface of the package. The laser marking apparatus is then controlled to make at least three passes with parameters known to provide readable, indelible marks at the predetermined power level.

BRIEF DESCRIPTION OF THE DRAWINGS

For a more complete understanding of this invention, reference is now made to the following description of the accompanying drawings, wherein.

DESCRIPTION OF THE PREFERRED EMBODIMENTS

Figure 1:
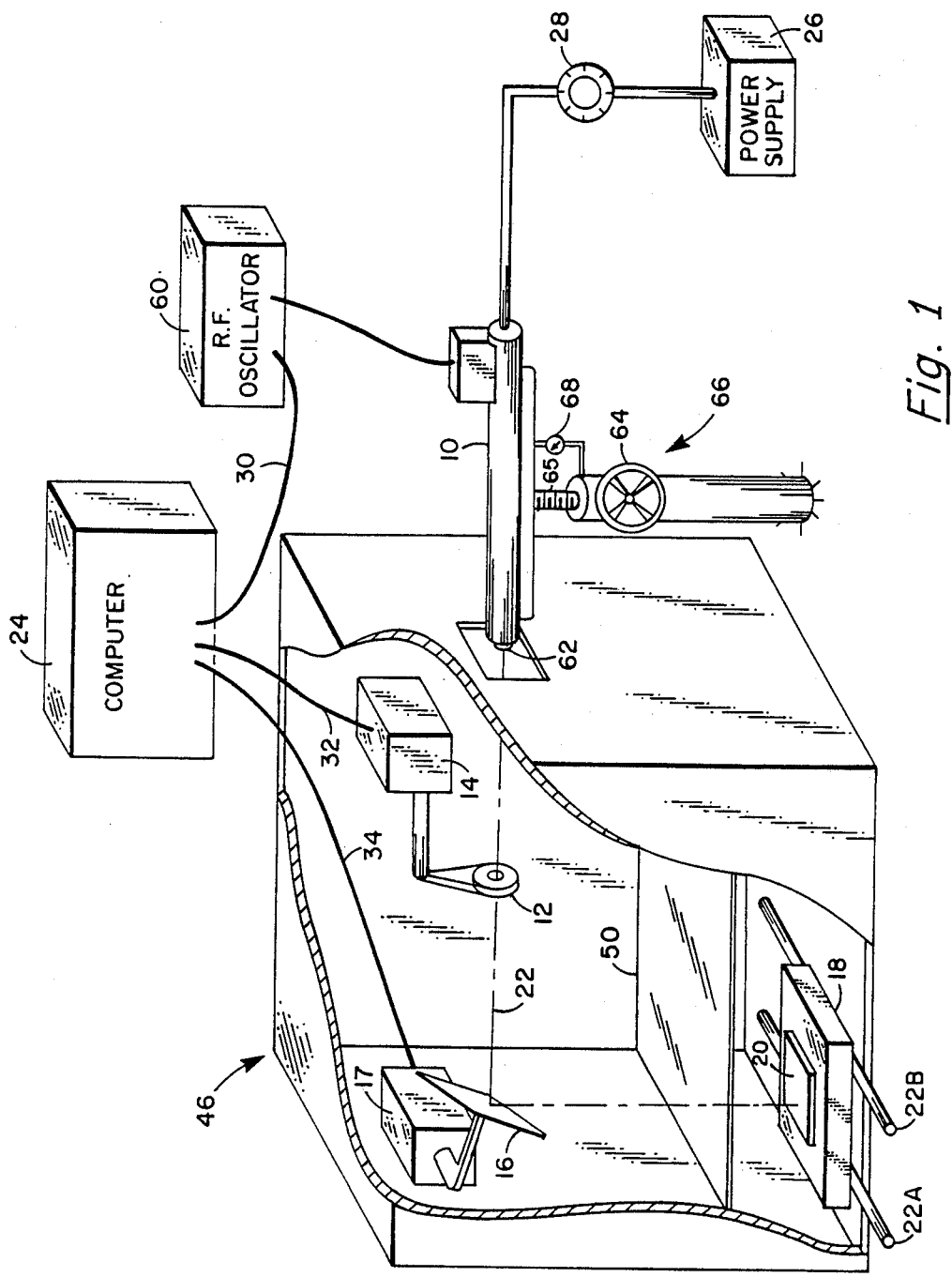
FIG. 1 is a block diagram, greatly simplified of a laser marking apparatus for use in marking packages according to the present invention.

Referring now to FIG. 1, a laser marking apparatus suitable for practicing the present invention is shown. Laser 10 produces a beam of laser light 22 having a width of 0.0059 inches. Here, laser 10 is a Nd:YAG laser capable of producing in excess of 25 watts of output power at a wavelength of 1.064 nanometers. Laser 10 has a focal length of 2.88 inches. Laser 10 is of the type which has a Q-switch frequency which can be changed. Command signal 30 generated by computer 24 controls a radio frequency (RF) oscillator. RF oscillator 60 is connected to laser 10. When RF oscillator, in response to control signal 30 does not produce a signal, laser light exits laser 10 in the form of laser beam 22. When oscillator 60 produces an RF signal, no light exits laser 10. Rather, power builds up inside laser 10 such that the peak power of laser beam 22 when the light is again allowed to exit laser 10 is increased. If RF oscillator is turned on and off periodically, at the "Q-switch" frequency, beam 22 will consist of a stream of light pulses with peak power varying inversely with the Q-switch frequency. In this way, computer 24 can control the Q-switch frequency of laser 10.

Laser beam 22 reflects from mirror 16, passes through collimating lens 62 and dust cover 50 and then strikes package 20. Dust cover 50 is optically transparent at the laser light wavelength and keeps dust and other particles from collimating lens 62, mirror 16 and other parts of the marking apparatus. Package 20 is mounted to a carrier 18 which slides in and out of enclosure 46. Here, carrier 18 slides on rails 22A and 22B. Enclosure 46 contains the path of laser beam 22 for safety reasons. Also included in enclosure 46 is mirror 16 which must be precisely controlled and not touched or disturbed during a marking operation.

Mirror 16 is controlled by mechanical drive 17. Mechanical drive 17 moves the mirror with two degrees of freedom. Mechanical drive 17 precisely positions mirror 16 in any known manner in response to command signal 34 from computer 24. Mirror 16 and drive means 17 represent any known means for positioning a beam in two dimensions. For example, using two mirrors, each capable of moving in one dimension would work just as well.

Collimator lens 62 focuses laser beam 22 to a point called the focal point. At the focal point, the energy per square inch of width of laser beam 22 is maximized. The position of the focal point relative to the surface of package 20 being marked can be controlled by adjusting the position of laser 10 by means of handle 64. Laser 10 is mounted on a support means 66 which can be moved up and down by turning handle 64. Support means 66 may be any known apparatus for firmly supporting equipment commonly used in optical work. In operation, handle 64 is adjusted to have the focal point of beam 22 approximately 15 mils below the surface of package 20 being marked.

Laser beam 22 passes through aperture 12. The beam is narrowed and attenuated upon passing through aperture 12. Aperture 12 may be completely rotated out of the path of laser beam 22 by motor 14. Motor 14 is controlled by command signal 32 from computer 24. The size and even the presence of aperture 12 is not critical to the present invention, as it will be described later that aperture 12 is rotated out of the path of laser beam 22 during marking according to the present invention.

One of skill in the art will recognize that marking apparatus operates using optical principles. The need for precise positioning of optical elements is well known. Therefore, the components of the laser marking apparatus of FIG. 1 must be rigidly connected using methods commonly used for work with optical components.

Power to laser 10 is provided by power supply 26, which is of known construction. The current to laser 10 is regulated by current regulator 28. Current regulator 28 operates in any known fashion and limits current to laser 10 to a value which can be adjusted.

Computer 24 is a general purpose digital computer of known construction. Computer 24 is programmed to generate control signals 30, 32 and 34 in a manner to be described below.

A laser marking apparatus such as shown in FIG. 1 and described above may be purchased. One source for such laser marking apparatus is Control Laser Corp. of 7503 Chancellor Drive, Orlando, Fla., U.S.A. Control Laser Corp. sells a suitable laser marking system under the brand name Instamark Elite.

In operation, a program is stored in computer 24. The program contains a description of where on package 20 marks should be made. Computer 24 computes the positions of mirror 16 required to make laser beam 22 trace a path over the positions where marks are required. Computer 24 then generates values of command signal 34 required to have mechanical drive 17 move mirror 16 into the computed position. For example, if the letter "T" is to be marked, computer 24 determines two intersecting lines, one vertical and the other horizontal must be drawn. Computer 24 then computes the commands for command signal 34 which cause the beam to trace out these two lines.

In some instances, the lines to be drawn must be wider than would be made by the beam passing over the package. The program might specify a particular line width. To make wider lines, laser beam 22 can be oscillated in a direction perpendicular to the direction in which the line is being drawn. In those instances, computer 24 generates values of command signal 34 which cause laser beams to trace out a line as well as oscillate.

The program stored in computer 24 might also specify if aperture 12 should be in or out of laser beam 22. Computer 24 generates values of command signal 32 to cause motor 14 to rotate aperture 12 to the desired position.

The program stored in computer 24 may also specify the Q-switch frequency of laser 10. Computer 24 also computes the desired values of command signal 30 to produce the appropriate Q-switch frequency.

To mark a package 20, the package is inserted into carrier 18 which is then slid into enclosure 46 beneath mirror 16. Computer 24 then executes the program stored in it. Laser 10, aperture 12 and mirror 16 are thus controlled to make the desired marks on package 20.

Figure 2:
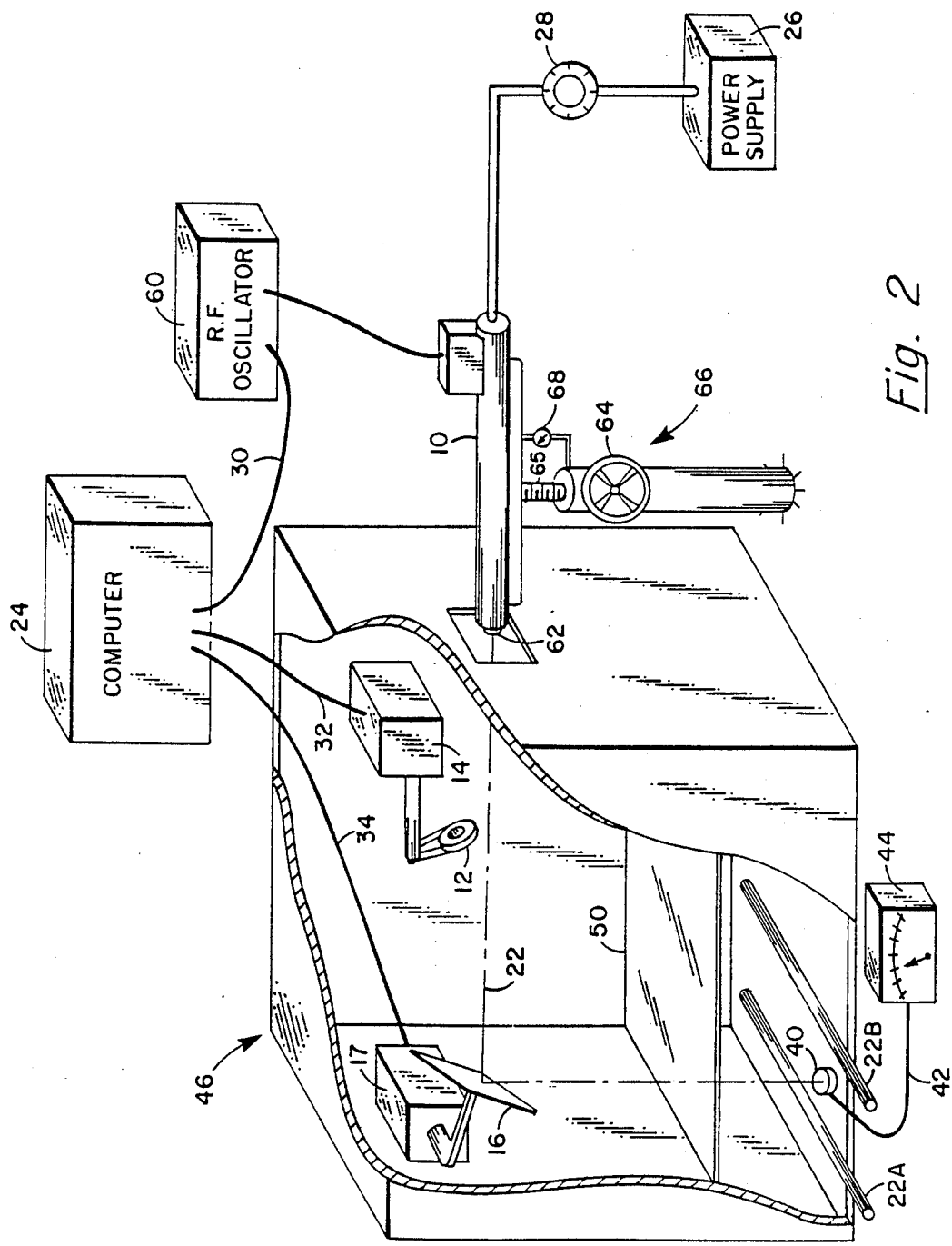
FIG. 2 is a block diagram of the laser marking apparatus configured to adjust the laser current.

Prior to marking package 20, the laser marking apparatus is configured as shown in FIG. 2. A power meter 44 is used to measure the power of beam 22. Carrier 18 is removed from enclosure 46 and a probe 40 is placed beneath mirror 16. The probe is connected to meter 44 via cable 42. To measure the power in laser beam 22, the Q-switch frequency is set to a very high value, here 50 KHz. Aperture 12 is removed from the path of beam 22. Mirror 16 is positioned to direct laser beam 22 to probe 40. Meter 44 indicates the power in laser beam 22. Current regulator 28 is then adjusted until meter 44 indicates the power in laser beam 22 equals a predetermined value.

After adjusting current regulator 28, probe 40 can be removed from enclosure 46. As shown in FIG. 2, though, probe 40 is permanently mounted to the floor of enclosure 46 beneath where carrier 18 is located during the marking operation. Thus, probe 40 and cable 42 can be left in place during the marking operation. One of skill in the art may note that in this arrangement, probe 40 is not at the focal point of laser beam 22. The only requirement, though is that probe 40 be large enough that all of beam 22 strike probe 40, since meter 44 measures the total power striking probe 40. It is actually better if probe 40 is not at the focal point of beam 22 since damage to probe 40 is more likely to result at the focal point.

The operation of setting the current into laser 10 may thus be simply and inexpensively performed. In a production environment where many packages must be marked, it is not necessary to adjust the laser current before each part is marked. The current might be adjusted at any convenient interval, such as each time the program is changed in computer 24 to mark new kinds of packages. However, if the laser marking apparatus is infrequently used, the laser current should be adjusted on a periodic basis, such as once every week. Use of the laser marking apparatus causes changes in the power output level. If the laser is used extensively, the current should be adjusted at much more frequent intervals.

As described previously, handle 64 is adjusted until the focal point of laser beam 22 is approximately 15 mils below the surface of package 20. The required setting of handle 64 may be simply determined. FIG. 1 shows a dial indicator 68 connected to support means 66. As handle 64 is turned, the portion of threaded shaft 65 extending beyond base 66 is increased, thereby elevating laser 10. One end of dial indicator 68 is attached to laser 10 and the other end is attached to base 66. The dial indicator thus measures changes in height of laser 10. Here, dial indicator 68 is of known construction and may be purchased commercially such as from the L. S. Starrett Co. of Athol, Mass., U.S.A. One of skill in the art will recognize that dial indicator 68 could be attached other than as shown as long as one end is connected to some portion of the marking apparatus which moves when laser 10 moves and the other end is connected to some portion which does not move when laser 10 moves.

To determine the correct position of handle 64, a package 20 is placed in the apparatus, as for marking. The Q-switch frequency is set to a value in the audible range, say 3 kHz. Laser 10 is turned on and handle 64 is turned. The surface of package 20 vibrates at the Q-switch frequency, which is audible. The intensity of vibration reaches a peak when the focal point of laser beam 22 is at the surface of package 20. The reading of dial indicator 68 at this point is a "base value" and represents a course approximation to the required height of laser 10. With a package positioned for marking, handle 64 is slowly raised in small increments, as indicated on dial indicator 68. At each increment, laser 10 is controlled to trace out one line on the package. After laser 10 has moved a very small number of increments, the beam striking the surface of package 20 will be so defocused that it does not make a mark. The dial reading at this setting is the "upper limit". Handle 64 is then adjusted to return dial indicator 68 to its base value. Laser 10 is then lowered in small increments in the same fashion until no mark is made on the package. This is the "lower limit". A better approximation of the position of laser 10 to focus laser beam 22 on the surface of package 20 is the point giving a dial indicator reading half way between the upper limit and the lower limit.

To place the focal point 15 mils below the surface, handle 64 is turned until the reading on dial indicator 68 is 15 mils less than the intermediate value. The same setting of dial indicator 68 can be used for all packages of the same type. If a thicker package is to be marked, the added thickness may be compensated for by simply raising laser 10 until dial indicator 68 shows laser 10 has been elevated by that thickness.

Thus, the inclusion of dial indicator 68 provides several advantages. It provides an easy way to locate the position of laser 10 needed to focus laser 10 appropriately. It also allows the marking apparatus to be easily adjusted for any size package.

EXAMPLE I

For beam current adjusted to provide a power in beam 22 of 25 Watts, the parameters of Table II can be used to mark on the lid of a package comprising a base layer of Kovar, a plating of nickel 100 to 300 microinches thick and a plating of gold 50 to 150 mircoinches thick. The parameters are selected for marking a 1 inch × 2 inch package with three rows of letters and numbers, each row about 2 mm high.

TABLE II

| PASS | 1 | 2 | 3 | 4 |
|---|---|---|---|---|
| Aperture | OUT | OUT | OUT | OUT |
| Q-Switch Frequency (KHz) | 4 | 8 | 15 | 50 |
| Speed (min/sec) | 100 | 400 | 8 | 20 |
| Line Width | N/A | N/A | 4 | N/A |

As described above, a four pass marking operation is used. Each column of Table II gives the values of parameters for each pass. For each pass, the following parameters are specified: the position of aperture 12; the Q-switch frequency of laser 10; the speed at which laser beam 22 moves across package 20 to draw a line; and the amplitude of the oscillation of laser beam 22 in a direction perpendicular to the line drawn. A value of "OUT" for aperture position implies that aperture 120 out of the path of laser beam 22. A value of N/A for the line width parameter means the laser beam 22 is not oscillated.

With the parameters of Table II, pass 1 causes jagged grooves to be cut in the package 20. The jaggedness results from the fact that laser beam 22 actually consists of a series of pulses. The grooves are thus really a series of closely spaced holes. Pass 2 smoothes out jagged sides of the grooves because it is done with a higher Q-switching frequency which means the pulses are closer together. After pass 1 and 2, dark material which was "blasted" out of the grooves covers the marking. This blasted out material, called "splatter", covers each of the three rows of characters marked on the package. The splatter also extends approximately ¾ mm on all sides of each row. Pass 3 is a wide pass which covers an entire row of characters rather than retracing the individual lines which make up each character. In pass 3, the beam is swept over an area which includes each row of characters and the splatter around the row. In pass 3, the splatter is vaporized or disappears in some other fashion. Pass 3 has the undesired effect of also decreasing the contrast of the groove. Pass 4 makes another pass over the grooves. It darkens the bottom of the groove without "blasting" any material out of it. In pass 4, the beam moves very slowly and heats up the metal of the package. This has the effect of annealing the dark material to the grooves.

EXAMPLE II

Table III lists values of parameters used to mark a ⅜ inch square metal package with three rows of letters approximately 1 mm high.

TABLE III

| PASS | 1 | 2 | 3 | 4 |
|---|---|---|---|---|
| Aperture | OUT | OUT | OUT | OUT |
| Q-Switch Frequency (KHz) | 4 | 8 | 15 | 50 |
| Speed (min/sec) | 100 | 400 | 3 | 20 |
| Line Width (mm) | N/A | N/A | 10 | N/A |

The entries in Table III are interpreted in the same way as the markings of Table II. These parameters differ from the parameters of Table II in the third pass. In pass 3, the line width is much wider. It covers all three rows of characters at once. In contrast, pass 3 in Example I required the laser beam to trace out three lines, one for each row of characters. The parameters of Example II can be more efficient for smaller packages.

Having described preferred embodiments of the present invention, it will not be apparent to one of skill in the art that various modifications might be made. Other types of laser marking apparatus than those shown in FIGS. 1 and 2 might be used. Other methods of holding packages might be desired. Other positions for probe 40 might be used. Additionally, the actual value of parameters used can deviate slightly from the exact parameter values listed in Tables II and III. For example, the second pass shown in each table might be eliminated. It is felt, therefore, that this invention should not be restricted to the disclosed embodiment, but rather should be limited only by the spirit and scope of the appended claims.

What is claimed is:

1. An improved process for marking metal packages using a laser marking apparatus of the type having:
    (i) a laser with an adjustable current input and a Q-switching frequency which can be controlled;
    (ii) means for directing a beam from the laser at portions of the metal package, said directing means being controllable to direct the laser beam to trace out a line on the package at a controllable speed, said directing means also being controllable to oscillate the beam perpendicular to the line with a controllable amplitude, the process comprising the steps of:
    (a) measuring the power in the laser beam and adjusting the current input of the laser until the beam has a predetermined power;
    (b) making a first pass with the laser beam across the regions of the package where markings are desired;
    (c) making a second pass with the laser beam across the regions of the package where markings are desired, said second pass comprising the step of oscillating the beam perpendicular to the direction of travel; and
    (d) making a third pass with the laser beam across the regions of the package where markings are desired.

2. An improved process for indelibly marking a line in a desired location on a metal package with a laser marking apparatus comprising the steps of:
    (a) adjusting the power in the laser beam to 25 Watts;
    (b) moving the laser beam over the location at a speed of approximately 100 mm/sec, said laser beam having a Q-switch frequency of approximately 4 KHz;
    (c) moving the laser beam over the desired location at a speed of approximately 400 mm/sec, said laser beam having a Q-switch frequency of approximately 8 KHz;
    (d) moving the laser beam over the desired location at a speed of 8 mm/sec while oscillating the beam in a direction perpendicular to the line with an amplitude of 4 mm, said laser having a Q-switch frequency of 15 KHz; and
    (e) moving the laser beam over the desired location at a speed of 20 mm/sec, said laser beam having a Q-switch frequency of 50 KHz.

3. In a laser marking apparatus of the type having a laser producing a beam of light directed at an object to be marked, means for moving the beam in a first direction and a second orthogonal direction, and means for precisely controlling the position of the laser, an improvement comprising:
    (a) means for measuring the position of the laser; and
    (b) means for measuring the power in the laser beam.

4. The process of claim 1 additionally comprising the step of:
    (a) focusing the beam from the laser at a focal point below the surface of the package.

5. The process of claim 4 wherein the focal point is 15 mils below the surface of the package.

6. The process of claim 2 wherein the metal package comprises:
    (a) a base layer of kovar;
    (b) a plating of nickel of the kovar base having a thickness of 100 to 300 microinches; and
    (c) a plating of gold over the nickel plating having a thickness of 50 to 150 microinches.

7. The apparatus of claim 3 additionally comprising:
    (a) means for adjusting the height of the laser relative to an object to be marked.

8. In a laser apparatus for marking an object, a method of determining the desired position of the laser, the method comprising the steps of:
    (a) setting the Q-switch frequency of the laser to a value in the audible range of frequencies;
    (b) directing the beam from the laser at the object; and (c) adjusting the distance between the laser and the object until the audible vibrations of the object are at a maximum.

9. The method of claim 8 additionally comprising the steps of:
(a) moving the laser closer to the object in small increments to a first position where the laser light makes no mark on the object;
(b) moving the laser away from the object to a second position where the laser light makes no mark on the object; and
(c) positioning the laser a predetermined distance closer to the object than the point half way between the first and the second point.

10. The process of claim 4 wherein the laser is focused at a focal point by adjusting the distance between the laser and the package.

11. The process of claim 10 wherein the distance between the object and the laser which focuses the beam at the desired focal point is selected according to a process comprising the steps of:
(a) setting the Q-switch frequency of the laser to a value in the audible range of frequencies;
(b) directing the beam from the laser at the object; and
(c) adjusting the distance between the laser and the object until the audible vibrations of the object are at a maximum.

* * * * *